(12) United States Patent
Sudjian

(10) Patent No.: US 6,222,423 B1
(45) Date of Patent: Apr. 24, 2001

(54) VOLTAGE CONTROLLED RING OSCILLATOR DELAY

(75) Inventor: Douglas Sudjian, Santa Clara, CA (US)

(73) Assignee: Micro Linear Corporation, San Jose, CA (US)

(*) Notice: Subject to any disclaimer, the term of this patent is extended or adjusted under 35 U.S.C. 154(b) by 0 days.

(21) Appl. No.: 09/244,279

(22) Filed: Feb. 3, 1999

(51) Int. Cl.[7] ....................................... H03B 5/02
(52) U.S. Cl. ..................... 331/57; 331/36 C; 331/175; 327/280; 327/281
(58) Field of Search ..................... 331/57, 36 C, 331/175, 177 R; 327/274, 280, 281

(56) References Cited

U.S. PATENT DOCUMENTS

| | | | |
|---|---|---|---|
| 4,866,314 | * | 9/1989 | Traa . |
| 5,635,878 | * | 6/1997 | Liu et al. ............................... 331/57 |
| 5,917,383 | * | 6/1999 | Tso et al. ............................... 331/57 |
| 5,945,863 | * | 8/1999 | Coy ....................................... 327/231 |

* cited by examiner

Primary Examiner—Arnold Kinkead
(74) Attorney, Agent, or Firm—Haverstock & Owens LLP

(57) ABSTRACT

A delay cell for use within a voltage controlled oscillator capable of operating at two different selectable frequencies, the delay cell having a first delay stage including a first differential pair of transistors, wherein the emitter or each transistor is coupled to a first common node and further wherein a first current exiting the first common node is selectively variable. The delay cell further having a second delay stage including a second differential pair of transistors, each having an emitter coupled to a second common node wherein a second current exiting the second common node is selectively variable and wherein a sum of the first current and the second current is substantially constant. The amount of delay associated with the first delay stage is dependent upon the level of the first current. The delay cell provides for a more linear relationship between output frequency and input voltage by controlling the first current through the first delay stage and the second current through the second delay stage such that a decrease in the first current is accompanied by an increase in the second current and, conversely, an increase in the first current is accompanied by a decrease in the second current and the sum of the first current and second current is substantially constant.

25 Claims, 8 Drawing Sheets

*Fig. 2*     (PRIOR ART)

VOLTAGE CONTROLLED RING OSCILLATOR DELAY

FIELD OF THE INVENTION

The invention generally relates to the field of voltage controlled ring oscillators. More specifically, the invention relates to an improved delay cell within a voltage controlled oscillator which provides a more linear relationship between a control voltage and an output frequency of the oscillator.

BACKGROUND OF THE INVENTION

A voltage controlled ring oscillator includes a number of delay cells n, arranged in a loop. Each cell propagates a clock signal sequentially around the loop and adds delay to the clock signal such that a sum of all the delays represents 360 degrees of phase shift. FIG. 1 shows a block diagram of a typical voltage controlled ring oscillator 100. The voltage controlled ring oscillator 100 has an even number of delay cells $t_1$–$t_4$. Each of these delay cells has a specified timing delay. The delay cells are individually controlled by an incoming voltage control signal $V_{CONT}$. The generation and control of this incoming voltage control signal, $V_{CONT}$ is well known in the art. In order to insure that the oscillator forms a clock signal having a 50% duty cycle within the desired frequency range of oscillation, the delay through each of the cells $t_1$–$t_4$ must be uniform. In conventional voltage controlled ring oscillators, the frequency is controlled by varying the delay associated with each delay cell $t_1$–$t_4$. However, if the frequency does not change in an incremental manner with respect to the control voltage, the result is a non-linear relationship between the input voltage, $V_{CONT}$ and the output frequency. This can cause problems when utilizing ring oscillators in phase-locked loops for data recovery.

FIG. 2 illustrates a block diagram of a prior art delay cell 200 within the voltage controlled ring oscillator of FIG. 1. As shown, an input signal CLKIN is coupled to the first delay element $t_1$. The output from the first delay element $t_1$, is coupled as an input to two additional delay elements, $t_2$ and $t_3$ thereby creating two separate delayed signal pathways. These two delayed signal pathways are each coupled as inputs to a summing junction which, when summed, result in an output signal CLKOUT which is delayed relative to the input signal CLKIN by the overall delay attributable to the individual delay cell within the ring oscillator, which is a weighted sum of each individual delay element within each delay cell comprising the ring oscillator. Generally, the timing delay associated with each delay cell within the voltage controlled ring oscillator must be controlled in order to reach the overall desired oscillation frequency.

One problem with the prior art voltage controlled ring oscillator arrangement is uniform control of each of the two delay pathways within each delay cell. Ideally, it is desired that the output frequency of the ring oscillator increase linearly as the input control voltage is increased. However, voltage drops due to layout, parasitic elements and other problems inherent in the design of the prior art delay cell of FIG. 2, result in nonuniform delays from cell to cell. This degrades the linear relationship between the control voltage and the output frequency of the voltage controlled ring oscillator. Accordingly, what is needed is a delay cell for a ring oscillator which provides a more controllable delay path. What is further needed is a ring oscillator having a plurality of delay cells, each having a uniform delay from cell to cell in order to maintain a precise output frequency. What is also needed is a ring oscillator wherein each delay is controlled with uniform delays between each delay cell element.

SUMMARY OF THE INVENTION

A delay cell in a voltage controlled ring oscillator of the present invention uses a two stage delay topology working in concert with a third stage. The third stage is used for amplification and performs a squaring function on the output waveforms to boost the output signal and decrease the rise time of the output signal. The first delay stage in the two stage delay arrangement includes a first pair of transistors with collectors coupled to collector loads, thereby forming a first pair of nodes. In certain circumstances a first and second terminal of a selectable capacitance circuit are also coupled to each of the nodes in the first pair of nodes, with a third terminal of the selectable capacitance circuit coupled to a low voltage supply, Vss to allow a selectable frequency for the ring oscillator. A high voltage supply, FVCC, is also coupled to each of the collector loads. The emitters of each transistor in the first pair of transistors, are coupled together and tied to the low voltage supply, Vss, through a first bias current source. The first bias current source has a constant component and a selectively variable component. In operation, as each transistor in the first pair of transistors is cycled through an activate-deactivate cycle, their collector loads are allowed to charge and discharge, yielding a delayed differential output voltage at the collectors of each transistor in the first pair of transistors due to the finite amount of time required to charge and discharge the collector loads. The total bias current of the first and second stages, along with the collector load resistances at each node in the first pair of nodes, ensure a constant rise and drop in the final signal voltage at the collectors of each transistor.

The first delay stage is coupled to a second delay stage, wherein the differential output voltage from the first delay stage is coupled to the second delay stage. The second stage includes a second pair of transistors with their bases coupled to the differential output voltage from the first delay stage and the collectors of both transistors coupled to the same collector loads of the first delay stage. The emitters of both transistors in the second pair of transistors are coupled together and tied to the low voltage supply Vss through a second bias current source. Unlike the first bias current source, the second bias current source does not have a constant component. Instead, the second bias current source is completely selectively variable. The second stage bias current is inversely related to the selectively variable component of the first stage bias current. A delay associated with the second stage represents a small fraction of the delay attributable to the first stage.

In operation, the output differential voltage at the first delay stage is stable, whereby the collector voltage at one node in the first pair of nodes is higher than the collector voltage at the other node in the first pair of nodes. As the first pair of transistors in the first delay stage are activated, the transistors switch state, such that a conducting transistor ceases to conduct, thereby allowing the voltage at the collector of the transistor to increase. Meanwhile, the non-conducting transistor will begin to conduct, thereby allowing the voltage at the collector to decrease. Accordingly, the two collector voltages of the first pair of transistors in the first delay stage will exponentially rise and fall in opposition such that a previously high voltage node will start to decrease and a previously lower voltage node will begin to increase. As one node voltage increases and the other node voltage decreases, the second pair of transistors in the second delay stage will switch state in the sense that a previously conducting transistor in the second pair will cease to conduct and a previously non-conducting transistor in the second pair will begin to conduct. As the common collector loads are allowed to charge and discharge in this repeatable fashion, the total current flowing through the first delay stage and the second delay stage remains constant, thereby ensuring a constant rise and drop in the voltage level at the common collectors of each transistor.

The invention is an improvement over prior art delay cell designs due to a more linear relationship between the input control voltage and the output frequency. Moreover, because the delay cell of the present invention uses only a two stage delay arrangement, wherein the first stage is controlled by a first bias current having a constant component and a selectively variable component and the second stage is controlled by a second bias current which is inversely related to the selectively variable component of the first bias current, the circuitry is smaller in size and dissipates less power in operation than prior art techniques.

DETAILED DESCRIPTION OF THE PREFERRED EMBODIMENT

A voltage controlled ring oscillator includes an even number of delay cells coupled in a ring to provide 180 degrees of phase shift. Differential outputs from a last delay cell of the voltage controlled ring oscillator are inverted and coupled to the inputs of a first delay cell, thereby creating a full 360 degrees of phase shift in the signal which propagates around the ring, to ensure oscillation.

Figure 1:
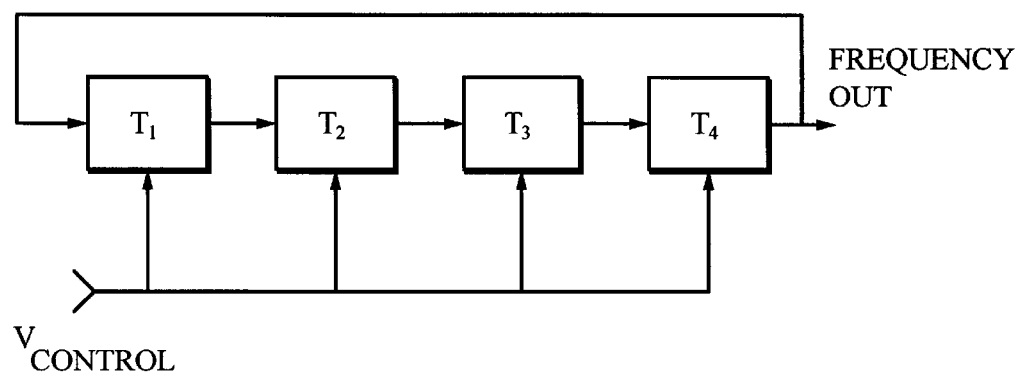
FIG. 1 illustrates a block diagram of a typical voltage controlled ring oscillator.
Figure 2:
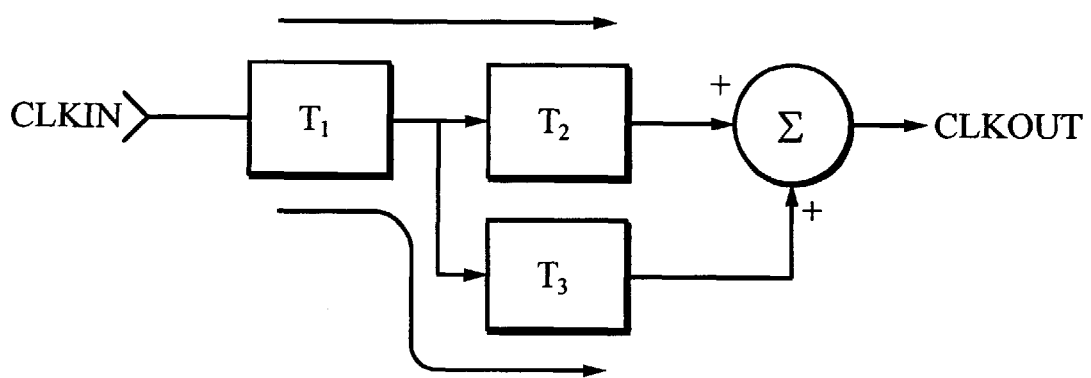
FIG. 2 illustrates a block diagram of a prior art delay cell within a typical voltage controlled ring oscillator.
Figure 3:
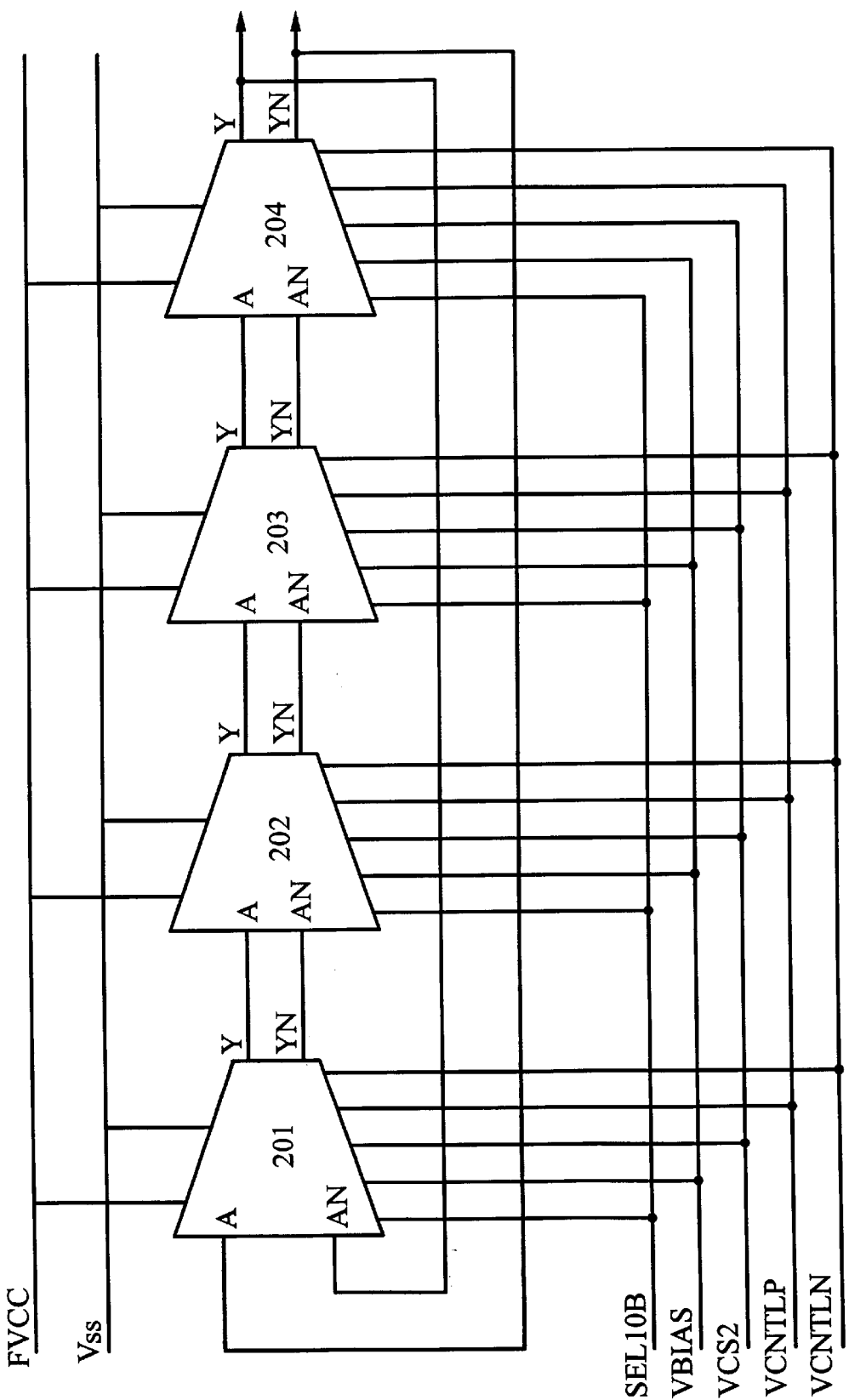
FIG. 3 illustrates a block diagram of a voltage controlled oscillator of the present invention.

FIG. 3 illustrates a block schematic diagram of the voltage controlled ring oscillator of the present invention. A differential pair of input signals, A and AN, represent an incoming differential voltage to each of four delay cells 201, 202, 203 and 204, while the outputs Y and YN represent an output differential voltage for each of the four delay cells 201, 202, 203 and 204. As shown, the outputs Y and YN of each of the delay cells 201, 202 and 203 are coupled to the inputs A and AN of the next delay cell, such that the outputs Y and YN of the delay cell 201 are coupled to the inputs A and AN of the delay cell 202, the outputs Y and YN of the delay cell 202 are coupled to the inputs A and AN of the delay cell 203, and the outputs Y and YN of the delay cell 20 3 are coupled to the inputs A and AN of the delay cell 204. The outputs Y and YN from the delay cell 204 are inverted and then coupled to the inputs A and AN of the delay cell 201. It is understood that any even or odd number of delay cells may be used in implementing the voltage controlled oscillator, without departing from the spirit and scope of the present invention.

A signal SEL10B is coupled to each of the delay cells 201–204 and selects between one of two center operating frequencies for the voltage controlled ring oscillator. When the signal SEL10B is inactive, the voltage controlled ring oscillator preferably operates at a center frequency of 125 MHz. When the signal SEL10B is active, the voltage controlled ring oscillator preferably operates at a center frequency of 80 MHz. An internal frequency select circuit responds to the SEL10B signal to switch between the two different center operating frequencies and is described in further detail herein. It will be understood by one of ordinary skill in the art that any convenient operating frequencies can be selected and that a selection of another pair of frequencies still falls within these teachings.

A high voltage supply, FVCC, and a low voltage supply, Vss, are both coupled to each of the individual delay cells 201–204. Control signals VBIAS, VCS2, VCNTLP and VCNTLN are also coupled to each of the delay cells 201–204. These signals control the operation of each delay cell within the voltage controlled ring oscillator as described in detail herein.

Figure 4:
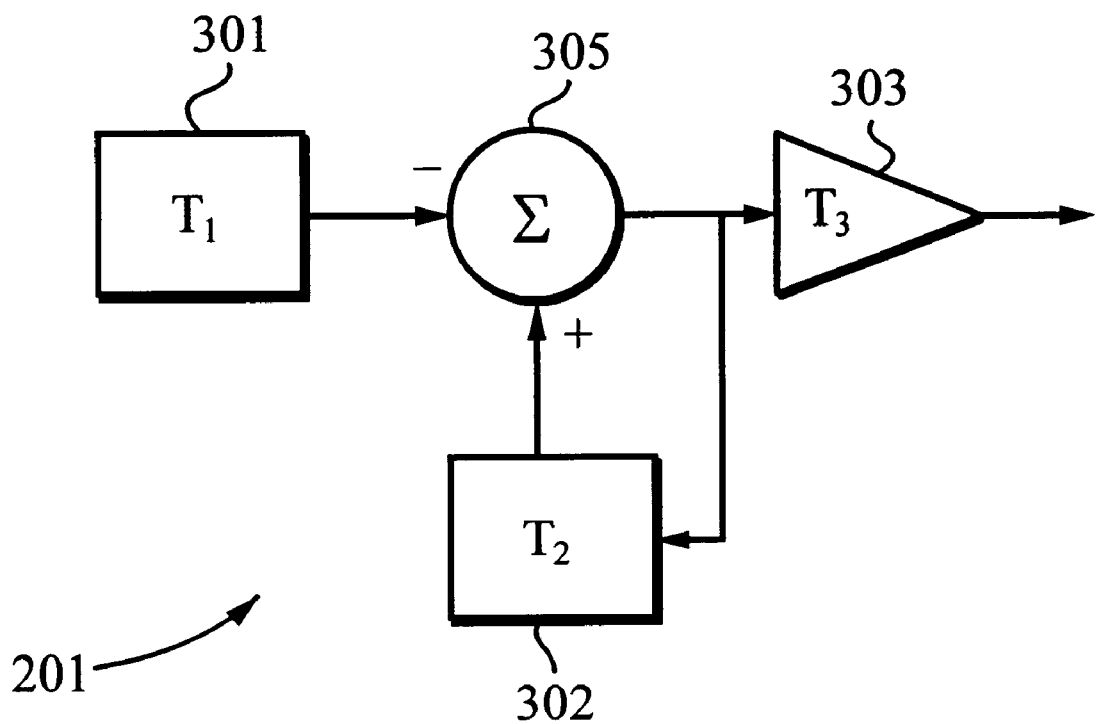
FIG. 4 illustrates a block diagram of a ring oscillator delay cell of the present invention.

FIG. 4 shows a block diagram for a first delay cell 201 of the present invention. It is understood that all four delay cells 201–204 are identical in structure to the delay cell 201, as illustrated in FIG. 4. As shown, the delay cell 201 includes three major blocks including a first delay block 301, a second delay block 302 and an amplification block 303. An output from the first delay block 301 is coupled as an input to a summing junction 305. An output from the summing junction 305 is coupled as an input to the second delay block 302. An output from the second delay block 302 is then coupled as an input to the summing junction 305, where it is summed with the output from the first delay block 301. The output from the summing junction 305 is also coupled as an input to the amplification block 303. In this diagram, a majority of the overall timing delay associated with the delay cell is attributable to a delay $t_1$, of the first delay block 301. The delay of the second delay block is a relatively small constant delay of $t_2$.

In the voltage controlled ring oscillator (FIG. 3), a number of the delay cells 201–204 (FIG. 3) are linked together to achieve the desired output frequency. The outputs Y and YN (FIG. 3) from each of the delay cells 201–204 (FIG. 3) are amplified, as needed, before they are input to the next delay cell. This amplification is performed by the amplification block 303. A finite timing delay of $t_3$, which is small in comparison with $t_1$, and $t_2$, is associated with the finite amount of time required to transmit the differential output signals Y and YN (FIG. 3) through the amplification block 303. Though small the timing delay of $t_3$ is preferably taken into account in designing a ring oscillator using the present invention.

Figure 5:
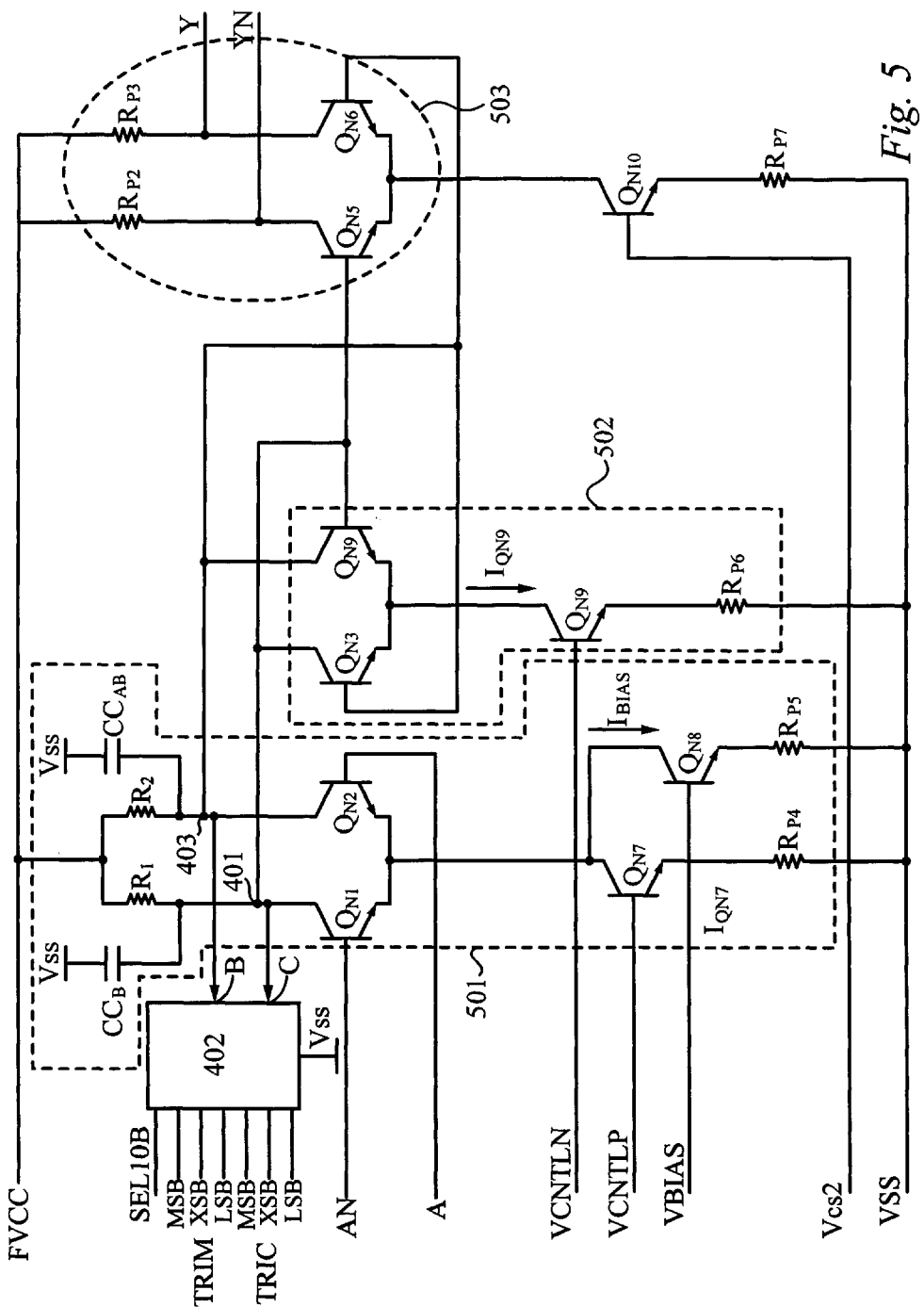
FIG. 5 illustrates a detailed schematic diagram of the ring oscillator delay cell of the present invention.

The structure and operation of each individual delay cell shall now be described in further detail. FIG. 5 shows a detailed schematic diagram for the voltage controlled ring oscillator delay cell 201 of the present invention. As described earlier, the differential pair of voltage signals AN and A are input to the delay cell 201. The output signal Y is a delayed version of the input signal, with the output signal YN being its inverse.

A first delay stage of the delay cell 201 corresponds with the first delay block 301 of FIG. 4 and is depicted by a dashed line 501 in FIG. 5. A second delay stage of the delay cell 201 corresponds with the second delay block 302 of FIG. 4 and is depicted by a dashed line 502 in FIG. 5. A final amplification stage of the delay cell corresponds with the amplification block 303 of FIG. 4 and is depicted by a dashed line 503 in FIG. 5. The summing junction 305 of FIG. 4 corresponds with a pair of nodes 401 and 403 in FIG. 5.

Referring now to FIG. 5, the incoming differential pair of voltage signals AN and A, respectively, are applied to the base of each transistor in a first differential pair of bipolar junction transistors QN1 and QN2 such that the signal A is coupled to the base of the transistor QN2 and the signal AN is coupled to the base of the transistor QN1. The collector of the transistor QN1 is coupled to the node 401. A first output terminal C of a selectable capacitance circuit 402 is also coupled to the node 401. A first terminal of a resistance R1 is coupled to the node 401 while the second terminal of the resistance R1 is coupled to the high voltage supply FVCC (also in FIG. 3). A first terminal of a capacitor CCB is coupled to the node 401 while the second terminal of the capacitor CCB is coupled to the low voltage source Vss (also in FIG. 3). The collector of the transistor QN2 is coupled to a node 403. A second output terminal B of the selectable capacitance circuit 402 is also coupled to the node 403. A first terminal of a resistance R2 is coupled to the node 403 while the second terminal of the resistance R2 is coupled to the high voltage source FVCC (also in FIG. 3). A first terminal of a capacitor CCAB is coupled to the node 403 while the second terminal of the capacitor CCAB is coupled to the low voltage source Vss (also in FIG. 3).

Figure 7A:
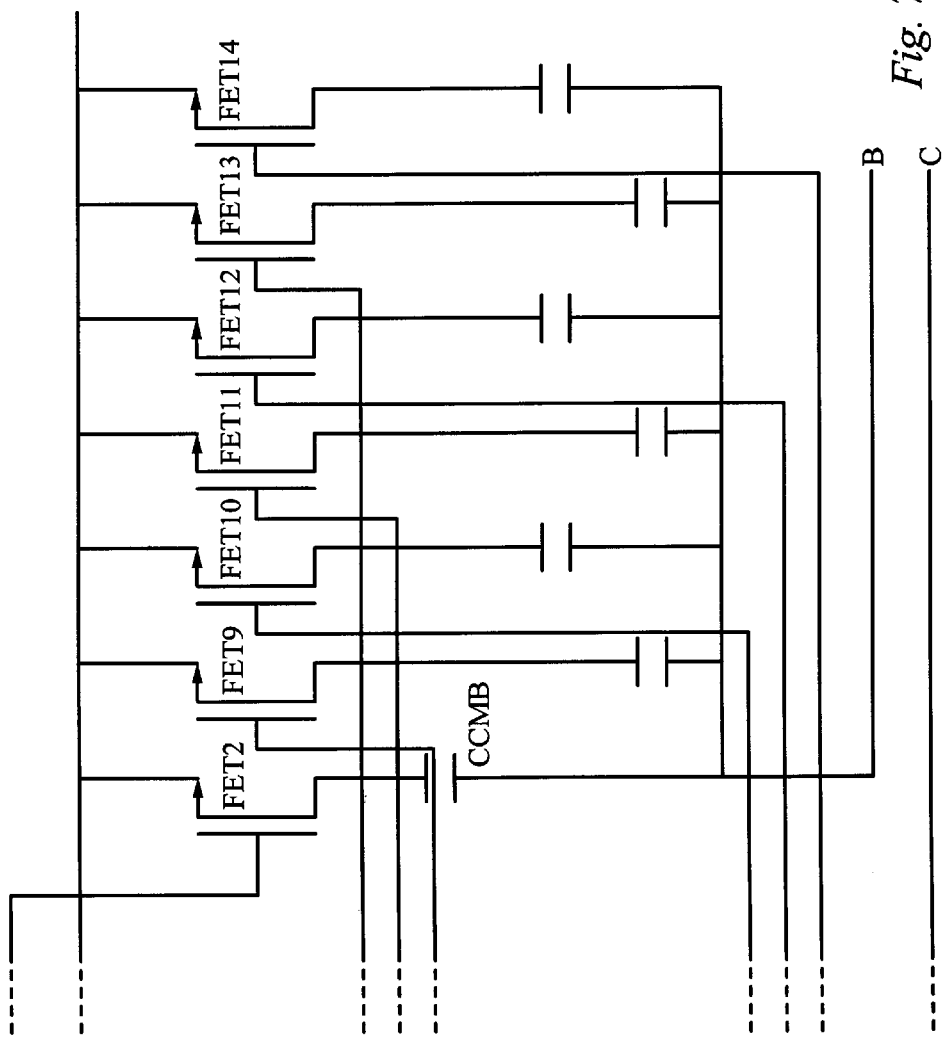
FIG. 7 illustrates a schematic diagram for a circuit which selects a capacitance in the RC load that is coupled to the collectors of the first pair of transistors in the first delay stage and coupled to the collectors of the second pair of transistors in the second delay stage of FIG. 5.
Figure 7A:
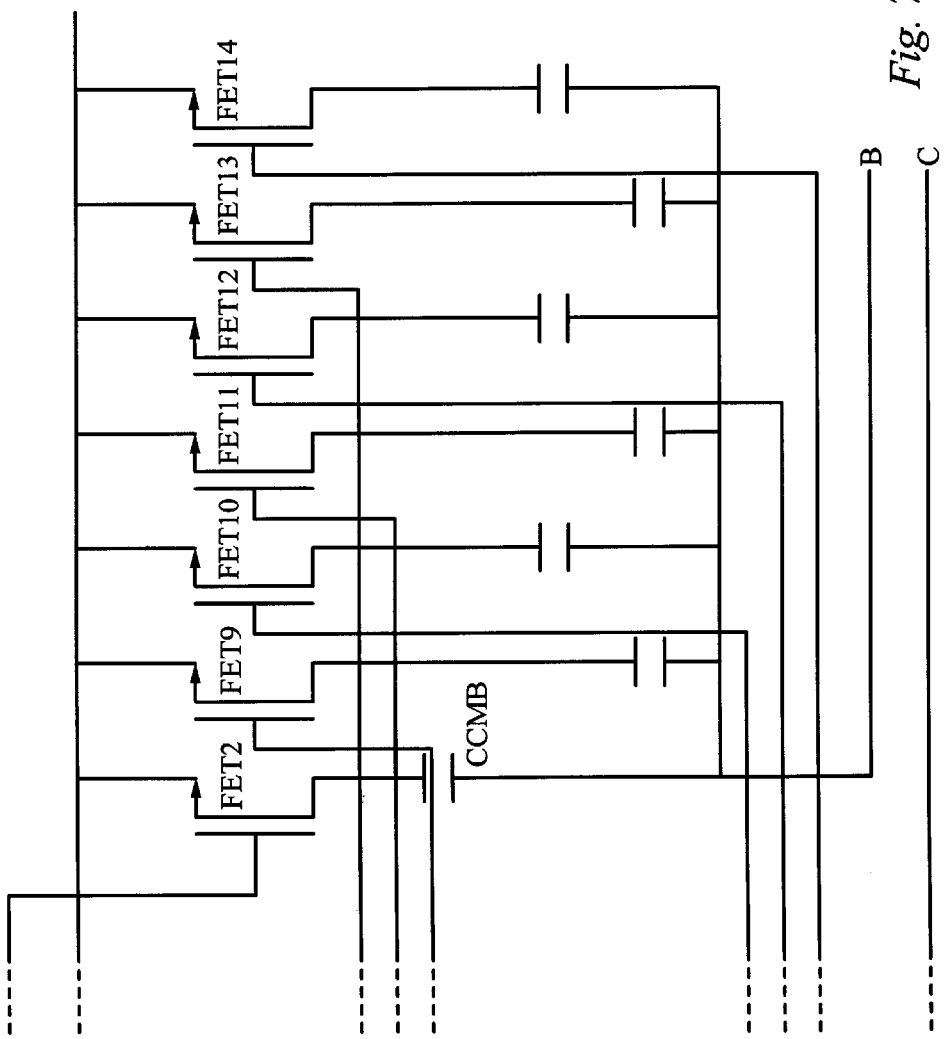

The selectable capacitance circuit 402 will be described in greater detail herein with reference to FIG. 7. For now, it is understood that the selectable capacitance circuit 402 serves as a variable capacitance, wherein the amount of capacitance is selectively variable and is coupled to the collectors of each of the transistors QN1 and QN2, respectively. The amount of capacitance selected will have a direct effect on the timing of the voltage drop across each of the differential pairs of transistors QN1 and QN2, as will be described in further detail herein, and, thus, will effect the timing delay of the cell 201.

The emitters of each of the transistors QN1 and QN2 are coupled together and to the collectors of two additional bipolar junction transistors QN7 and QN8. The emitters of each of the transistors QN7 and QN8 are coupled to the low voltage supply Vss through resistors RP4 and RP5, respectively, such that the emitter of the transistor QN7 is coupled to the low voltage supply Vss through the resistor RP4 and the transistor QN8 is coupled to the low voltage supply Vss through the resistor RP5. A signal VCNTLP (FIG. 3) is coupled to the base of the transistor QN7. Thus, when the signal VCNTLP is active, the transistor QN7 is operational. A signal VBIAS is coupled to the base of transistor QN8. Accordingly, when the signal VBIAS is active, the transistor QN8 is operational. The differential input signals A and AN, and the signals VCNTLP and VBIAS control the operation of the first pair of transistors QN1 and QN2 in the first delay stage 501. The resistances R1 and R2, along with the fixed CCB and CCAB and selectable capacitance circuit 402, associated with the nodes 401 and 403 affect the amount of time required for the voltage at the outputs of the first delay stage 501 to rise and fall The outputs from the first delay stage 501 are coupled to the inputs of a second delay stage 502 and to the inputs of an amplification stage 503.

The second delay stage 502 includes a second differential pair of bipolar junction transistors QN3 and QN4. The collector of the transistor QN3 is coupled to the node 401, while the collector of the transistor QN4 is coupled to the node 403. The base of the transistor QN3 is coupled to the node 403 and the base of the transistor QN4 is coupled to the node 401. The emitters of both of the transistors QN3 and QN4 are coupled together and are further coupled to the collector of a transistor QN9. The emitter of the transistor QN9 is coupled to the low voltage source Vss through a resistor RP6, while the base of the transistor QN9 is coupled to the signal VCNTLN (FIG. 3). When the signal VCNTLN is active, the transistor QN9 is operational and the second delay stage 502 is active.

In operation, when the incoming voltage A is low and the voltage AN is high, the transistor QN2 is turned off while the transistor QN1 is turned on. When the circuit is in this state, the selectable capacitance 402 at node B is charged by the high voltage source FVCC and the voltage at node 403 is driven high. If the incoming voltage A then becomes high and AN becomes low, the transistor QN2 is turned on while the transistor QN1 is turned off. When the circuit is in this state, the selectable capacitance 402 at node B begins to discharge any built up charge through the transistor QN2 and the voltage at node 403 is driven low.

Conversely, when the incoming voltage AN is low and voltage A is high, the transistor QN2 is on, while the transistor QN1 is turned off. When the circuit is in this state, the selectable capacitance 402 at node C is charged by the high voltage source FVCC, causing the voltage at node 401 to be driven high. If the incoming voltage A then switches to low and the voltage AN becomes high, the transistor QN1 is turned on while the transistor QN2 is turned off. When this occurs, the selectable capacitance 402 at node C begins to discharge any built up charge through the transistor QN1, and the voltage at node 401 is driven low.

The amount of current which is drawn through the first stage 501 (i.e. the transistors QN1 and QN2) and the second stage 502 (i.e. the transistors QN3 and QN4) affects the voltage levels at nodes 401 and 403. This total current is controlled by operation of the signals VCNTLP, VCNTLN and VBIAS.

The current which passes through either of the transistors QN1 or QN2 in the first differential pair of transistors, includes a constant component first stage bias current $I_{BIAS}$ and a variable component first stage bias current $I_{QN7}$. The constant component of the first stage current, $I_{BIAS}$, is equal to the amount of current which passes through the transistor QN8 when it is operational. The variable component of the first state bias current, $I_{QN7}$, is equal to the amount of current which passes through the transistor QN7 when it is operational. In operation, the signal VBIAS is always active and, hence, the transistor QN8 is always on. This ensures that the constant component first stage bias current, $I_{BIAS}$, always passes through the transistors QN1 and QN2 when either one is on.

The timing of the voltage rise and voltage drop at nodes 401 and 403 is fine tuned by operation of the signals VCNTLN and VCNTLP, which control the amount of variable current, $I_{QN7}$, which passes through the transistor QN7 of the first stage and the amount of variable current, $I_{QN9}$, which passes through the transistor QN9 of the second stage, respectively. Preferably, the signals VCNTLN and VCNTLP have the same voltage when the ring oscillator is oscillating at the desired designed center frequency set by the collector load time constant values of capacitance and resistance at the nodes 401 and 403. When the signal VCNTLP is increased and the signal VCNTLN is decreased, the transistor QN7 is turned on harder than the transistor QN9. This causes the amount of current drawn through the first stage 501 to increase relative to the current in the second stage 502 in opposition by the same amount. Similarly, when the signal VCNTLP is decreased and the signal VCNTLN is increased, the transistor QN9 is turned on harder than the transistor QN7. This causes the amount of current drawn through the second stage 502 to increase relative to the current in the first stage 501 in opposition by the same amount.

While it is possible to adjust the signals VCNTLN and VCNTLP a sufficient amount to turn the transistors QN7 and QN9 completely on and/or off relative to one another, this is not preferred. The preferred design according to the present invention prevents either transistor QN7 or QN9 from entering either cut-off or saturation, but rather keeps their operation in the linear (active) region. This design is achieved by appropriately selecting the gm of the cell as is well known in the prior art. In this way, both QN7 and QN9 are always operating in the active state. Such a design will allow quick frequency adjustments while avoiding operation of the ring oscillator in the so-called open-loop mode.

The control signals VCNTLN and VCNTLP, and hence the respective currents $I_{QN7}$ and $I_{QN9}$, may be generated using any convenient means known in the art, such as transconductance amplifiers (not shown). For example, a voltage is applied to such a transconductance amplifier such that VCNTLN (or VCNTLP) is the corresponding output. As the input voltage is increased, the signal VCNTLN (or VCNTLP) is increased.

The level of each of the currents $I_{QN7}$ and $I_{QN9}$ which passes through each of the transistors QN7 and QN9, respectively, is controlled by the operation of the signals VCNTLN and VCNTLP such that when the current $I_{QN9}$ which passes through the transistor QN9 is increased, the current $I_{QN7}$ which passes through the transistor QN7 is decreased and vice-versa. Furthermore, it is understood that the constant component of the first stage bias current, $I_{BIAS}$, is preferably maintained at a higher level than the variable current $I_{QN9}$ which passes through the second stage so that the total current which passes through the first stage ($I_{BIAS}$+ $I_{QN7}$) is greater than the total current in the second stage, $I_{QN9}$.

It is understood that the time constant associated with the charging and discharging of the selectable capacitance 402, and the capacitors CCB and CCAB, controls the actual time delay and operating frequency. A larger capacitance increases the delay while a smaller capacitance decreases the delay. The operation of the selectable capacitance will be described in further detail with reference to FIG. 7.

The final amplification stage 503 preferably includes a third differential pair of bipolar junction transistors QN5 and QN6. The collectors of each transistor QN5 and QN6 are coupled to the high voltage supply FVCC through resistors RP2 and RP3, respectively. The emitters of each of the transistors QN5 and QN6 are coupled together and further coupled to the collector of a bipolar junction transistor QN10. The base of the transistor QN10 is coupled to a signal VCS2 while the emitter of the transistor QN10 is coupled to the low voltage supply Vss through a resistor RP7.

In operation, the amplification stage 503 has a minimal delay and acts as a squaring function on the rise time of the delayed output signals Y and YN. When the voltage at node 403 is high and the voltage at node 401 is low (as discussed earlier, this occurs when the incoming signal A is low and the signal AN is high), the transistor QN6 is on, while the transistor QN5 is off. In this state, the output at Y is at a lower voltage than the output at YN which is at a higher voltage. Conversely, when the voltage at node 403 is low and the voltage at node 401 is high (as previously discussed, this occurs when the incoming signal A is high and the signal AN is low), then the transistor QN6 is off, while the transistor QN5 is on. In this state, the output at Y is at a higher voltage than the output at YN, which is at a lower voltage.

Since the third pair of transistors QN5 and QN6 have only parasitic capacitance at their collectors, the rise and fall times of each of their collector voltages is much quicker than the rise and fall times of the collector voltages of the first pair of transistors QN1 and QN2 in the first delay stage 501, and the third pair of transistors QN5 and QN6 provide a signal gain which square offs the rise and fall transition times in the output signals Y and YN with respect to the exponential voltage signals at the nodes 401 and 403.

Figure 6:
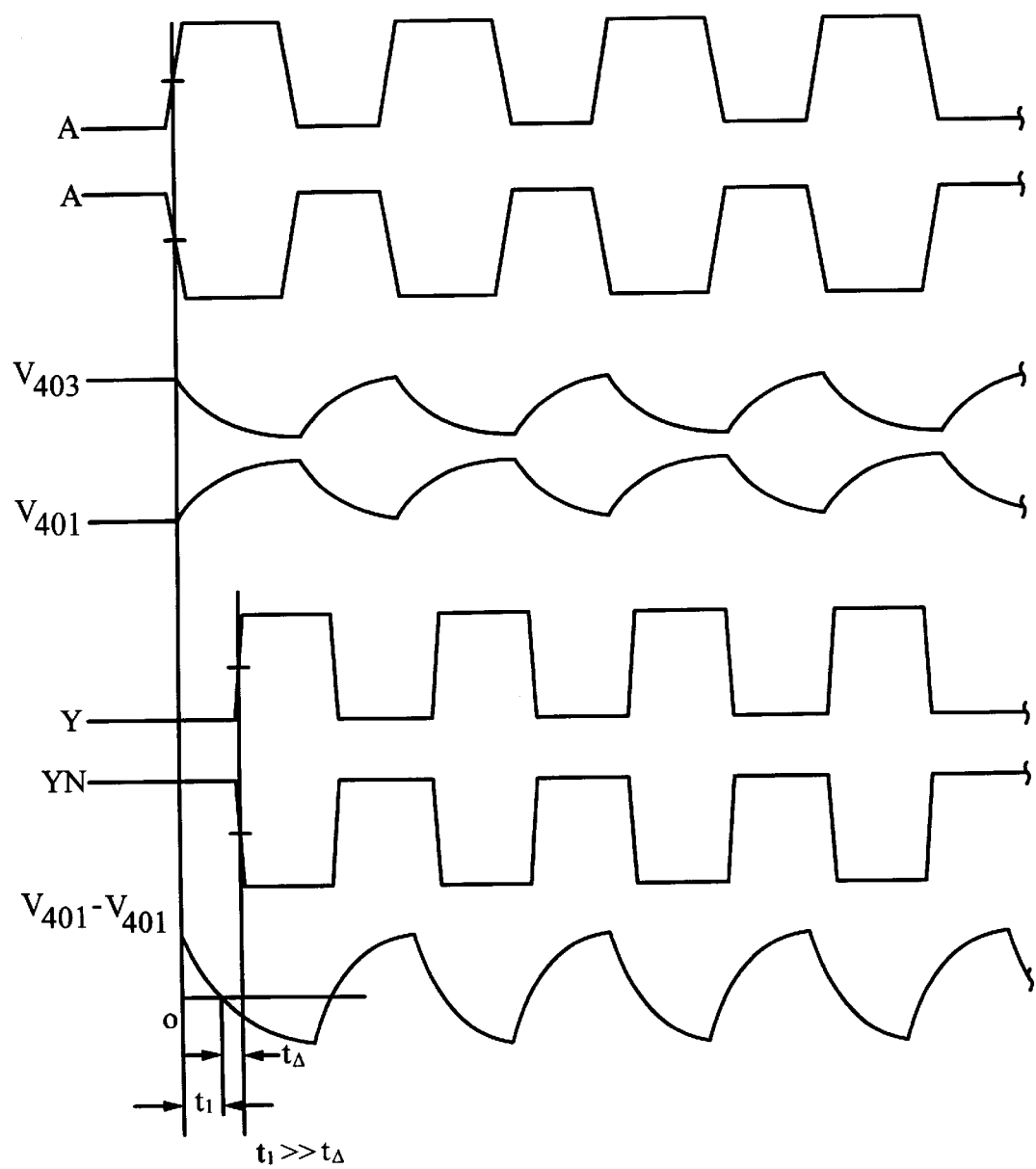
FIG. 6 illustrates timing diagrams for the voltage levels of the delay cell illustrated in FIG. 5.

FIG. 6 shows timing diagrams for the voltage levels in the delay cell 201 of FIG. 5. In operation, the collector differential voltage of the first stage is presumed stable at times between changes in the input signal. Thus, the voltage of one collector (QN1 or QN2) is higher than the opposing collector voltage. For example, if QN1 has a lower collector voltage, it will sink current through its respective load resistor R1. In this example, the second stage will sink current through the transistor QN3. The transistors QN2 and QN4 do not conduct current in this example. Upon an input excitation (i.e., the inputs change state) the transistors QN2 and QN4 begin to conduct while the transistors QN1 and QN3 stop conducting. When this occurs, the voltage on the collector of the transistor QN1 begins to rise exponentially while the voltage on the collector QN2 begins to fall exponentially. When the voltages on the collectors of the transistors QN1 and QN2 become approximately equal (a zero differential), the transistors in the second stage then begin to change states. The length of the delay is dependent upon the rate of the change of these voltages.

The timing diagram shows exemplary waveforms for the incoming signals A and AN along with waveforms for the voltage levels at nodes 401 and 403 and the output voltages Y and YN. In the diagram, the base to emitter voltage for each of the bipolar junction transistors in the first pair of transistors, the second pair of transistors, and the third pair of transistors is assumed to be approximately 0.7 volts for illustration purposes. As shown, as the voltage level of AN decreases and the voltage level of A increases, the transistor QN1 (FIG. 5) is switched off and the transistor QN2 (FIG. 5) is switched on. As this occurs, the selectable capacitance circuit 402 begins to discharge at B (FIG. 5), as current is drawn through the transistor QN2 and begins to charge at C (FIG. 5). As the selectable capacitance circuit 402 charges at C, the voltage at the collector of QN1 (i.e. the voltage at node 401) increases. Further, as the selectable capacitance circuit discharges as B (FIG. 5), the voltage at the collector of QN2 (i.e. the voltage at node 403) decreases. Subsequently, as the voltage level of AN increases and the voltage level of A decreases, the transistor QN1 is switched on and the transistor QN2 is switched off. When this occurs, the selectable capacitance 402 begins to discharge at C as current is drawn through the transistor QN1, causing the voltage at node 401 to drop, while the selectable capacitance circuit 402 begins to charge at B, causing the voltage at node 403 to rise.

Finally, as the voltage at node 403 increases, the transistor QN6 is turned on and current is drawn down through the transistor QN6, causing the voltage at the collector of QN6 to drop (i.e. the output voltage Y decreases). Conversely, if the voltage at node 403 decreases, then transistor QN6 is turned off and no current is drawn through the transistor QN6. Accordingly, the output at Y is high. Alternately, as the voltage at node 401 increases, transistor QN5 is turned on and current is drawn down through the transistor QN5, causing the voltage at the collector of QN5 to drop (i.e. the output voltage YN decreases). If the voltage at node 401 decreases, the transistor QN5 is shut off and no current is drawn through the transistor QN5. When this happens, the output at YN goes high. As the diagram in FIG. 6 shows, the majority of the timing delay $t_1$, between the input signals A and AN and the output signals Y and YN is associated with the operation of the first delay stage 501 and the second delay stage 502 and the rise and fall times of the collector voltages at nodes 401 and 403. A small percentage of the timing delay, labeled as t▲, is the result of the amplification stage.

As described earlier, the variable capacitance circuit 402, the resistors R1 and R2, and the capacitors CCB and CCAB each operate to control the rise and fall time of the collector voltages at the nodes 401 and 403 (FIG. 5) in the first delay stage 501. The larger the RC time constant, the greater the delay associated with this stage. FIG. 7 shows a schematic diagram for the selectable capacitance circuit 402 which selects a given capacitance in the RC load that is coupled to the collectors of QN1 and QN2 at the nodes 401 and 403 in the first delay stage 501. As shown, the control signal SEL10B is coupled to the gate of two different field effect transistors FET1 and FET2. The sources of each of the transistors FET1 and FET2 are coupled to the low voltage supply Vss. The drain of the transistor FET1 is coupled to a capacitor CCLB while the drain of the transistor FET2 is coupled to a capacitor CCMB. As described earlier, the voltage controlled oscillator is preferably configured to operate at either one of two different center frequencies of 80 MHz or 125 MHz. The capacitors CCB and CCAB (FIG. 5) are used alone when operating at the center frequency of 125 MHz. If the user wishes to have the oscillator operate at the lower center frequency of 80 MHz, the signal SEL10B will be activated and the transistors FET1 and FET2 will both turn on. When this occurs, the additional capacitance CCLB is applied to the output A at node 401 (FIG. 5) in the delay cell 201 while the additional capacitance CCMB is applied to output B at node 403 (FIG. 5) in the delay cell 201. This allows a user to select the desired center frequency for the voltage controlled ring oscillator.

However, due to layout parasitic characteristics and process variations inherent in the design and manufacture of the voltage controlled ring oscillator, it may begin operating within a range about the selected center frequency. The difference between the actual center operating frequency and the desired center operating frequency may increase. In such a case, capacitance may be added or substituted, as appropriate, in order to finely tune or trim the range about the center operating frequency of the voltage controlled oscillator. It is desirable to attain the desired center frequency when the differential input control voltage (VCNTLP–VCNTLN) equal zero. As described earlier, this is done by using the selectable capacitance circuit 402. As shown in FIG. 6, the selectable capacitance circuit 402 depicts six pairs of field effect transistors FET3–FET14 which are arranged in parallel. There are three selectable pairs FET3–FET8 for coupling to the node 401 at the collector of the transistor QN1 (FIG. 5) and three selectable pairs FET9–14 for coupling to the node 403 at the collector of the transistor QN2 (FIG. 5). The sources of each of these transistors FET3–FET14 is coupled to the low voltage supply Vss. The gates of each transistor FET3–FET14 are tied to one of the signal line pairs of TR1MMSB and TR1OMSB, TR1MXSB and TR1OXSB, or TR1MLSB and TR1OLSB. The gates of the transistors FET3 and FET13 are coupled to the signal line TRIMMSB, while the gates of the transistors FET4 and FET14 are coupled to the signal line TRIOMSB. The gates of the transistors FET5 and FET11 are coupled to the signal line TRIMXSB, while the gates of the transistors FET6 and FET12 are coupled to the signal line TRIOXSB. Finally, the gates of the transistors FET7 and FET9 are coupled to the signal line TRIMLSB, while the gates of the transistors FET8 and FET10 are each coupled to the signal line TRIOLSB. The drains of each of the transistors FET3–FET14 are coupled to a separate capacitor. In order for the circuit to operate at optimal levels, it is preferable that the transistors FET3 and FET13 are coupled to capacitors of the same value, that the transistors FET4 and FET14 are coupled to capacitors of the same value, that the transistors FET5 and FET11 are coupled to capacitors of the same value, that the transistors FET6 and FET12 are coupled to capacitors of the same value, that the transistors FET7 and FET9 are coupled to capacitors of the same value, and that the transistors FET8 and FET10 are coupled to capacitors of the same value. In this way, when one of the signal lines TRIMMSB, TRIMXSB, TRIMLSB, TRIOLSB, TRIOXSB and TRIOMSB is activated, the corresponding field effect transistors FET3–FET14 will turn on and equal capacitance will be applied to the collectors of the transistors QN1 and QN2 at the nodes 401 and 403 (FIG. 5). It is understood that one half of the selectable capacitance circuit 402 mirrors the other half such that the same capacitance will be coupled to both the transistor QN1 and the transistor QN2 whenever a single pair of the signal lines TRIMMSB, TRIMXSB, TRIMLSB, TRIOLSB, TRIOXSB and TRIOMSB is chosen. Additionally, the capacitances tied to each of the signal lines are binarily weighted, such that the capacitors coupled to the xXSB lines (TR1MXSB and TR1OXSB) are twice the value of the capacitors coupled to the xLSB lines (TR1MLSB and TR1OLSB) and the capacitors coupled to the xMSB lines (TR1MMSB and TR1OMSB) are twice the value of the capacitances coupled to the xXSB lines (TR1MXSB and TR1OXSB).

In operation, when one of these pairs of signal lines becomes active, the corresponding pair of capacitors are coupled to the collectors of the transistor QN1 and the transistor QN2, respectively. Alternatively, the activation of the signal lines TRIMMSB, TRIMXSB, TRIMLSB, TRIOLSB, TRIOXSB and TRIOMSB may be mixed in order to achieve the desired capacitance at each of the nodes 401 and 403.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components, current levels, and voltage levels disclosed herein.

What is claimed is:

1. A delay cell having an input and an output, the delay cell comprising:

a. a summing junction;

b. a first delay element having an input and a first delayed output signal coupled to the summing junction, wherein the input of the first delay element forms the input of the delay cell, the first delay element being current controlled, the current flowing through the first delay element including a constant bias current and a variable bias current; and c. a second delay element having an input coupled to the summing junction and a second delayed output signal also coupled to the summing junction, whereby the second delayed output signal is summed with the first delayed output signal by the summing junction, the second delay element being current controlled whereby the sum of the current flowing through the first delay element and the second delay element is constant.

2. The delay cell according to claim 1 further comprising an amplification element having an input and an output wherein the input of the amplification element is coupled to the output of the summing junction and the output of the amplification element forms the output of the delay cell.

3. A delay circuit for generating a delayed output signal from an input signal, the delay circuit comprising:

a. a summing junction;

b. a first delay stage including:
   i. a first input node pair coupled to the input signal; and
   ii. a first differential pair of transistors, each having a base coupled to the first input node pair, each having an emitter coupled to a first common node wherein a first current exiting the first common node is selectively variable, and each having a collector coupled to the summing junction, the first delay stage being controlled by the first current, the first current including a constant bias current and a variable bias current; and c. a second delay stage including:
   i. a second input node pair coupled to the summing junction; and
   ii. a second differential pair of transistors, each having a base coupled to the second input node pair, each having an emitter coupled to a second common node wherein a second current exiting the second common node is variable, the second delay stage being controlled by the second current, and wherein a sum of the first current and the second current is substantially constant, and each having a collector coupled to the summing junction.

4. A delay circuit for generating a delayed output signal from an input signal, the delay circuit comprising:

a. a first delay stage including a first differential pair of transistors, each having an emitter coupled to a first common node wherein a first current exiting the first common node is selectively variable and wherein the first current includes a constant component and a variable component, the first delay stage being controlled by the first current; and b. a second delay stage including a second differential pair of transistors, each having an emitter coupled to a second common node wherein a second current exiting the second common node is variable and wherein a sum of the first current and the second current is substantially constant, the second delay stage being controlled by the second current.

5. The delay circuit as claimed in claim 4 wherein the constant component is formed by a first transistor coupled to the first common node and biased with a constant control signal.

6. The delay circuit as claimed in claim 4 wherein the variable component is formed by a second transistor coupled to the first common node and biased with a first variable control signal.

7. The delay circuit as claimed in claim 3 wherein the second current is formed by a transistor coupled to the second common node and biased by a variable control signal.

8. The delay circuit as claimed in claim 7 wherein the variable control signal is formed by a transconductance element wherein an input to the transconductance element controls a delay of the delay cell.

9. The delay circuit according to claim 3 wherein a delay of the first delay stage is dependent upon a level of the first current and wherein a delay of the second delay stage is dependent upon a level of the second current and further wherein an overall delay of the delay circuit is selectively variable.

10. The delay circuit according to claim 3 wherein the second current can be selectively reduced thereby effectively eliminating a delay of the second delay stage.

11. The delay circuit according to claim 3 further comprising a third delay stage coupled to the first delay stage including a pair of transistors which operate to increase the rise time of the delayed output signal.

12. The delay circuit according to claim 3 wherein the first current is greater than the second current at all times.

13. A delay circuit for generating a delayed output signal from an input signal, the delay circuit comprising:

a. a summing junction;

b. a first delay stage including:
   i. a first input node pair coupled to the input signal; and
   ii. a first differential pair of transistors, each having a base coupled to the first input node pair, each having an emitter coupled to a first common node wherein a first current exiting the first common node is selectively variable, and each having a collector coupled to the summing junction, the first current including a constant bias current and a variable bias current, the first delay stage being controlled by the first current; and c. a second delay stage including:
   i. a second input node pair coupled to the summing junction; and
   ii. a second differential pair of transistors, each having a base coupled to the second input node pair, each having an emitter coupled to a second common node wherein a second current exiting the second common node is variable and wherein an increase in the first current is accompanied by a decrease in the second current, the sum of the first current and the second current being constant, and each having a collector coupled to the summing junction, the second delay stage being controlled by the second current.

14. The delay circuit according to claim 13 wherein a delay of the first stage is dependent upon a level of the first current and wherein a delay of the second stage is dependent upon a level of the second current and further wherein an increase in the first current and a decrease in the second current is accompanied by an increase in a delay of the delay circuit.

15. The delay circuit according to claim 13 wherein the first current is greater than the second current at all times.

16. The delay circuit according to claim 13 further comprising a third delay stage coupled to the first delay stage including a pair of transistors which operate to increase the rise time of the delayed output signal.

17. A delay circuit for generating a delayed output signal from an input signal, the delay circuit comprising:
  a. a summing junction;
  b. a first delay stage including:
    i. a first input node pair coupled to the input signal; and
    ii. a first differential pair of transistors, each having a base coupled to the first input node pair, each having an emitter coupled to a first common node wherein a first current exiting the first common node is selectively variable, and each having a collector coupled to the summing junction, the first current including a constant bias current and a variable bias current, the first delay stage being controlled by the first current; and
  c. a second delay stage including:
    i. a second input node pair coupled to the summing junction; and
    ii. a second differential pair of transistors, each having a base coupled to the second input node pair, each having an emitter coupled to a second common node wherein a second current exiting the second common node is variable and wherein a decrease in the first current is accompanied by an increase in the second current, the sum of the first current and the second current being constant, and each having a collector coupled to the summing junction, the second delay stage being controlled by the second current.

18. The delay circuit according to claim 17 wherein a delay of the first stage is dependent upon a level of the first current and wherein a delay of the second stage is dependent upon a level of the second current and further wherein a decrease in the first current and an increase in the second current is accompanied by a decrease in a delay of the delay circuit.

19. A delay circuit for generating a delayed output signal from an input signal in a voltage controlled oscillator, the delay circuit comprising:
  a. a first delay stage including a first differential pair of transistors controlled by a constant collector current and a selectable capacitance circuit coupled to the collectors of each of the differential pair of transistors, the current in the first delay stage including a constant bias current and a variable bias current;
  b. a second delay stage coupled to the first delay stage and including a second differential pair of transistors having a positive feedback, the second delay stage being controlled by a variable current, the sum of the current through the first delay stage and the second delay stage being constant; and
  c. a third delay stage coupled to the first delay stage and including a pair of transistors which operate to square the rise time of the delayed output signal.

20. A ring oscillator comprising a plurality of delay cells wherein each delay cell includes a first delay element having a first differential pair of transistors and a second delay element having a second differential pair of transistors, wherein each transistor in the first differential pair has an emitter coupled to a first common node and each transistor in the second differential pair has an emitter coupled to a second common node and further wherein a first current at the first common node is selectively variable, the first current includes a constant component and a variable component, the first current controlling the first delay element, and a second current at the second common node is variable such that a sum of the first current and the second current is substantially constant, the second current controlling the second delay element.

21. The delay cell as claimed in claim 20 wherein the constant component is formed by a first transistor coupled to the first common node and biased with a constant control signal.

22. The delay cell as claimed in claim 20 wherein the variable component is formed by a second transistor coupled to the first common node and biased with a first variable control signal.

23. A ring oscillator comprising a plurality of delay cells wherein each delay cell includes a first delay element having a first differential pair of transistors and a second delay element having a second differential pair of transistors, wherein each transistor in the first differential pair has an emitter coupled to a first common node and each transistor in the second differential pair has an emitter coupled to a second common node and further wherein a first current at the first common node is selectively variable and a second current at the second common node is selectively variable such that a sum of the first current and the second current is substantially constant, wherein the second current is formed by a third transistor coupled to the second common node and biased by a second variable control signal.

24. A ring oscillator having a plurality of delay cells wherein each delay cell includes a summing junction, a first delay element having an input and a first delayed output signal coupled to the summing junction, the first delay element being controlled by a first current, the first current including a constant bias current and a variable bias current, and a second delay element having an input coupled to the summing junction and a second delayed output signal also coupled to the summing junction, whereby the second delayed output signal is summed with the first delayed output signal by the summing junction, the second delay element being controlled by a variable second current, the sum of the first current and the second current being constant.

25. A ring oscillator according to claim 24 wherein each of the plurality of delay cells further includes an amplification element having an input and an output wherein the input of the amplification element is coupled to the output of the summing junction and the output of the amplification element forms an output of the delay cell.

* * * * *